United States Patent
Lu et al.

(10) Patent No.: US 8,101,038 B2
(45) Date of Patent: Jan. 24, 2012

(54) DOUBLE-SIDED METAL CLAD LAMINATE AND FABRICATION METHOD THEREOF

(75) Inventors: Charng-Shing Lu, Hsinchu (TW); Shu-Chu Shih, Hsinchu (TW); Jinn-Shing King, Hsinchu County (TW); Shur-Fen Liu, Hsinchu County (TW)

(73) Assignee: Industrial Technology Research Institute, Hsinchu County (TW)

( * ) Notice: Subject to any disclaimer, the term of this patent is extended or adjusted under 35 U.S.C. 154(b) by 496 days.

(21) Appl. No.: 12/404,311

(22) Filed: Mar. 15, 2009

(65) Prior Publication Data
US 2010/0035066 A1    Feb. 11, 2010

(30) Foreign Application Priority Data
Aug. 11, 2008    (TW) ................ 97130509 A

(51) Int. Cl.
*B32B 37/00* (2006.01)
*B32B 37/02* (2006.01)
*B32B 37/10* (2006.01)
*B32B 37/15* (2006.01)

(52) U.S. Cl. .............. 156/244.24; 156/244.11; 156/297; 156/299; 156/307.1; 156/307.7; 156/308.2; 427/372.2; 427/384; 427/385.5; 427/388.1; 427/409; 428/212; 428/457; 428/458; 428/473.5

(58) Field of Classification Search .................. None
See application file for complete search history.

(56) References Cited

U.S. PATENT DOCUMENTS

| 5,112,694 | A |  | 5/1992 | Konotsune et al. |
|---|---|---|---|---|
| 5,420,233 | A | * | 5/1995 | Isogai et al. .................. 528/353 |
| 5,604,041 | A | * | 2/1997 | Choi ........................ 428/473.5 |
| 6,146,480 | A | * | 11/2000 | Centanni et al. .............. 156/151 |
| 6,346,298 | B1 |  | 2/2002 | Takahashi et al. |
| 7,232,610 | B2 | * | 6/2007 | Katsuki et al. ............... 428/458 |
| 2007/0042202 | A1 | * | 2/2007 | Park et al. .................... 428/458 |

FOREIGN PATENT DOCUMENTS

| JP | 06-190335 | * | 7/1994 |
|---|---|---|---|
| WO | 2004/085146 A1 | | 10/2004 |

* cited by examiner

*Primary Examiner* — Vivian Chen
(74) *Attorney, Agent, or Firm* — Pai Patent & Trademark Law Firm; Chao-Chang David Pai

(57) ABSTRACT

The invention discloses double-sided metal clad laminates and fabrication methods thereof. A plurality of polyamic acid coatings is co-extruded on a first metal foil and heat imidization to provide a multilayer polyimide film. A second metal foil is hot pressed on the multilayer polyimide film, thus providing a double-sided metal clad laminate. The polyamic acid coatings include a first, a second, and a third polyamic acid coating with surface tensions of S1, S2, and S3, respectively, satisfying relations of S1>S2>S3, wherein the first polyamic acid coating is the coating directly applied on the first metal foil.

15 Claims, 3 Drawing Sheets

DOUBLE-SIDED METAL CLAD LAMINATE AND FABRICATION METHOD THEREOF

CROSS REFERENCE TO RELATED APPLICATIONS

This application is based upon and claims the benefit of priority from the prior Taiwan Patent Application No. 97130509, filed on Aug. 11, 2008, the entire contents of which are incorporated herein by reference.

BACKGROUND OF THE INVENTION

1. Field of the Invention

The invention relates to a double-sided metal clad laminate, and more particularly to an adhesiveless double-sided metal clad laminate.

2. Description of the Related Art

With the recent rapid progress of miniaturization and high integration of electronic devices using flexible printed circuit boards, there is an increasing demand for double-sided laminates to cope with the trend for lighter and higher-density circuits. Conventional double-sided clad laminates include a PI base film coated with adhesives such as epoxy or urethane resin on both sides. The use of adhesives, however, increases the thickness of the final product, making it undesirable for use in fine pitch circuits. Moreover, adhesives can cause curling or result in poor dimensional stability and solder resistance. To overcome these problems, adhesiveless double-sided clad laminates have been proposed.

There are various methods for fabricating adhesiveless double-sided clad laminate, such as laminating a copper foil coated with polyimide coating on both sides of the foil.

U.S. Pat. No. 5,112,694 discloses a method for making adhesiveless double-sided clad laminate with single-layer polyimide coating by the following steps. A high glass transition temperature (Tg) polyimide resin is prepared and directly coated on a copper foil. After being subjected to thermal imidization, another copper foil is laminated thereon. In spite of the simple process, such a thermoplastic polyimide usually has a very high Tg (>300° C.), and therefore necessitates a lamination temperature of above 380° C., which is higher than the operational temperature of commercial laminating machines, resulting in minimal commercial applications.

WO2004/085146A1 discloses a polyimide film with a two-layer structure including a polyimide resin with low coefficient of thermal expansion and a thermoplastic polyimide resin The polyimide resin with low coefficient of thermal expansion and the thermoplastic polyimide resin are coated on a copper foil to provide a copper foil/low coefficient of thermal expansion polyimide resin/thermoplastic polyimide resin structure. After cyclized by heating, another copper foil is heat pressed on the copper foil/low coefficient of thermal expansion polyimide film/thermoplastic polyimide film structure. It has been found, however, that the double-sided metal clad laminate has an asymmetric structure. Since the coefficient of thermal expansion of the thermoplastic polyimide film is quite larger than that of the low coefficient of thermal expansion polyimide film, the double-sided metal clad laminate is apt to warp during the circuit etching process.

An already proposed double-sided clad laminate includes a polyimide film with a three-layer structure. First, a first thermoplastic polyimide resin is coated on a copper foil. After drying, a polyimide resin with low coefficient of thermal expansion is coated on the first thermoplastic polyimide resin. After drying, Next, a second thermoplastic polyimide resin is coated on the polyimide film with low coefficient of thermal expansion after drying, thereby providing a copper foil/thermoplastic polyimide resin/low coefficient of thermal expansion polyimide resin/thermoplastic polyimide resin structure. After cyclized by heating, another copper foil is hot pressed on the copper foil/thermoplastic polyimide film/low coefficient of thermal expansion polyimide film/thermoplastic polyimide film structure. The obtained double-sided metal clad laminate has a symmetric structure and achieves the objective of flatness. When considering an interface between the two different polyimide films, the solvent residual of each layer should be controlled. As disclosed in U.S. Pat. No. 6,346,298, the solvent residual of the first thermoplastic polyimide resin has to be controlled to between 20-30%, and the solvent residual of the low coefficient of thermal expansion polyimide resin has to be controlled to between 30-50%, and the solvent residual of the second thermoplastic polyimide resin has to be controlled to between 30-50%, in order to overcome the interface problems. Therefore, the process is rather complicated.

Accordingly, there is a need for an adhesiveless double-sided clad laminate which can provide good reliability without needing a complicated process and high lamination temperature.

BRIEF SUMMARY OF THE INVENTION

An exemplary embodiment of a method for fabricating double-sided metal clad laminates includes providing a first metal foil, co-extruding a plurality of polyamic acid coatings on the first metal foil, heat imidization the plurality of polyamic acid coatings to provide a multilayer polyimide film, and hot pressing a second metal foil on the multilayer polyimide film, to complete the double-sided metal clad laminate. The plurality of polyamic acid coatings include a first polyamic acid coating, a second polyamic acid coating, and a third polyamic acid coating with a surface tension of S1, S2, and S3, respectively, satisfying relations of S1>S2>S3, wherein the first polyamic acid coating is the coating directly applied on the first metal foil.

Another exemplary embodiment of a double-sided metal clad laminate includes a first metal foil; a multilayer polyimide resin; and a second metal foil, wherein the multilayer polyimide resin is formed between the first and second metal foils, and the multilayer polyimide resin includes: a first polyamic acid coating; a second polyamic acid coating; and a third polyamic acid coating, wherein the second polyamic acid coating is formed on the first and third polyamic acid coatings, and the first and third polyamic acid coatings respectively include: a thermoplastic polyamic acid, an inorganic additive, and a surfactant.

Preferably, the weight ratio of the surfactant is of between 0.01-1.0%, based on the total solid content of the first polyamic acid coating or the third polyamic acid coating, and the amount of the surfactant of the third polyamic acid coating is larger than that of the amount of the surfactant of the first polyamic acid coating.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
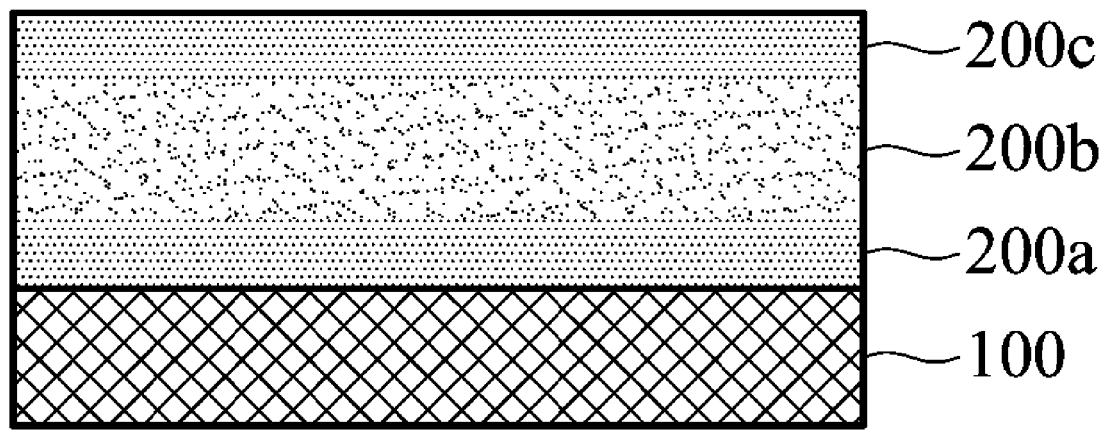
FIGS. 1-4 are cross sections of a method for fabricating a double-sided metal clad laminate according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The just mentioned features of the system are well known and are omitted from the drawing for the sake of clarity. For convenience, the invention takes a double-sided metal clad laminate employing copper foils as an example. Except for the copper foils, the double-sided metal clad laminates of the invention can include foils made up of Au, Ni, Al, Ag, or combinations thereof. The following elements and processes are disclosed for the purpose of illustrating the general principles of the invention and should not be taken in a limiting sense. Further, the term "a layer formed on another layer" means the layer formed directly on and contacting another layer or formed on another layer separated by an inter-layer.

In the embodiments of the invention, a key feature of the invention is that the surface tension of each polyamic acid coatings is controlled to satisfy a specific relation, and the plurality of polyamic acid coatings are formed on a metal foil in a single process by co-extruding. After cyclized by heating, another copper foil is heat pressed on the obtained multilayer polyimide film, thus fabricating an adhesiveless double-sided clad laminate. The method of the invention has advantages of having a simplified process and reduced cost, and the obtained product has superior flatness and thermal resistance.

Please refer to FIG. 1, in the embodiments of the invention, the thermoplastic polyamic acid coating and thermal resistant polyamic acid coating are formed on a copper foil 100 in a single process by co-extruding, thereby forming a thermoplastic polyamic acid coating 200a/thermal resistant polyamic acid coating 200b/thermoplastic polyamic acid coating 200c three-layer structure.

Particularly, the first and third polyamic acid coatings 200a and 200c serve as adhesives of the double-sided metal clad laminate, and the second polyamic acid coating 200b serves as a base film of the coefficient of thermal expansion polyamic acid coating.

Figure 2:
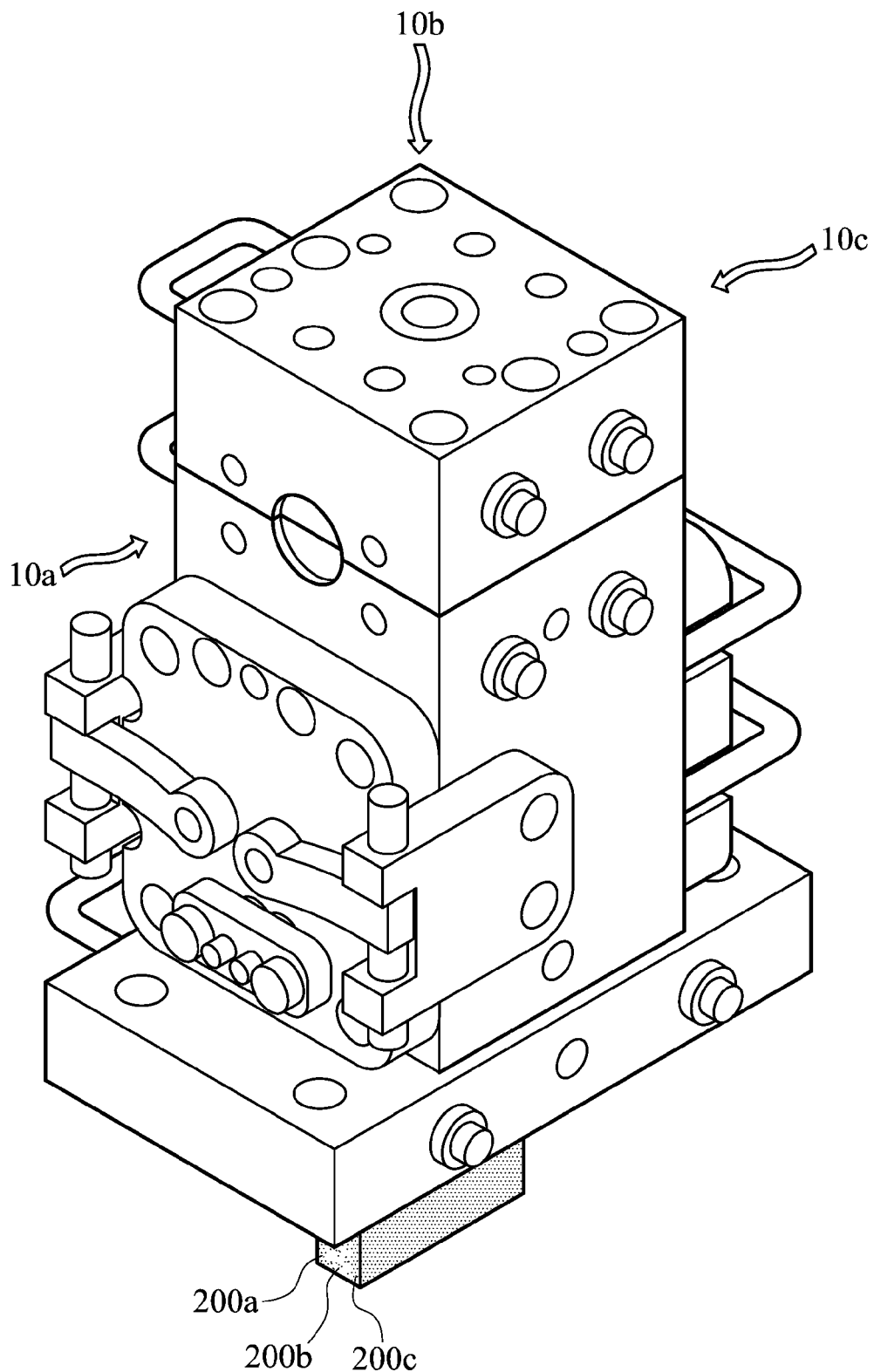

The polyamic acid coatings can be co-extruded by a co-extrusion feedblock or a multilayer co-extrusion die. FIG. 2 is a schematic drawing of the co-extrusion feedblock 10 in an embodiment of the invention. The labels 10a, 10b, 10c respectively indicate the feeding direction of the first, second, and third polyamic acid. The coating amount of the first, second, and third polyamic acid is controlled and extruded by a precision gear pump.

After convergence, the plastic is provided from a discharging side of the co-extrusion feedblock 10 and co-extruded on a copper foil via of the runner of the extrusion die (not shown).

In order to form a three-layer coating by co-extruding, the surface tension of the first polyamic acid coating, the second polyamic acid coating, and the third polyamic acid coating must be controlled to satisfy relations of S1>S2>S3, wherein the labels S1, S2, and S3 indicate respectively the surface tension of the first polyamic acid coating, the second polyamic acid coating, and the third polyamic acid coating. Further, the first polyamic acid coating is the coating directly applied on the first copper foil.

The components and contents of the polyamic acid coatings are disclosed below. In the invention, the first and third polyamic acid coating 200a and 200c can be the same or different and include (1) thermoplastic polyamic acid; (2) inorganic additive; (3) surfactant; and (4) solvent.

In an embodiment, in order to provide a stable symmetrical structure, the first polyamic acid coating and the third polyamic acid coating have same components and same amounts of components, but do not have the same amounts of surfactant.

In another embodiment, the first polyamic acid coating and the third polyamic acid coating have substantially different compositions. For example, the first polyamic acid coating and the third polyamic acid coating include different kinds or amounts of the thermoplastic polyamic acid, inorganic additive, or surfactant.

Preferred examples of the thermoplastic polyamic acid were prepared by reacting tetracarboxylic dianhydride monomer with diamine Monomer. The tetracarboxylic dianhydride monomer can include 3,3',4,4'-biphenyl tetracarboxylic dianhydride (BPDA), 3,3',4,4'-benzophenone-tetracarboxylic dianhydride (BTDA), 4,4'-oxydiphthalic anhydride (ODPA), 3,3',4,4'-diphenylsulfone tetracarboxylic dianhydride (DSDA), and the like. Preferred examples of the diamine monomer include p-phenylene diamine (P—PDA), 4,4'-oxydianiline (4,4'-ODA), 3,4'-Oxydianiline (3,4'-ODA), 2,2-Bis(4-[4-aminophenoxy]phenyl)propane (BAPP), 2,2-Bis(4-[3-aminophenoxy]phenyl)sulfone (m-BAPS), 1,4-Bis(4-aminophenoxy)benzene (TPE-Q), 1,3-Bis(4-aminophenoxy)benzene (TPE-R), 1,3-Bis(3-aminophenoxy)benzene (APB), diamino siloxane, or H2N—(CH2)n-(SiR2-O)n-SiR2-(CH2)n-NH2).

It is to be noted that the tetracarboxylic dianhydride or diamine monomers can be used independently or used in combinations. The above thermoplastic polyamic acids include the structure represented by:

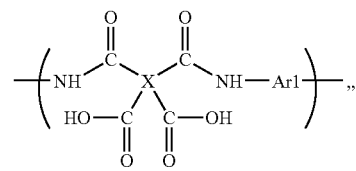

wherein X represents a quadrivalent aromatic group. Preferred examples of X include, but are not limited to:

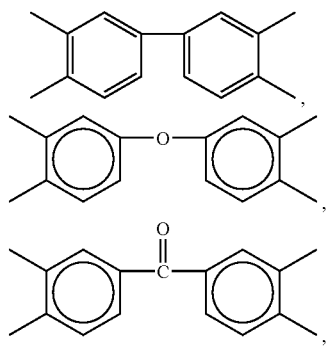

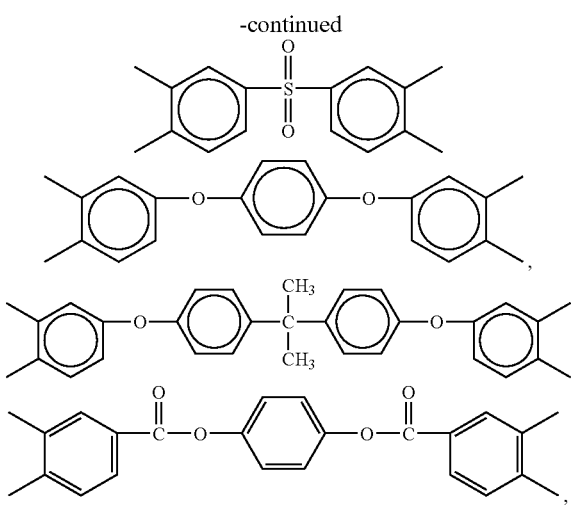

wherein Ar1 represents a bivalent aromatic group. Preferred examples of Ar1 include, but are not limited to:

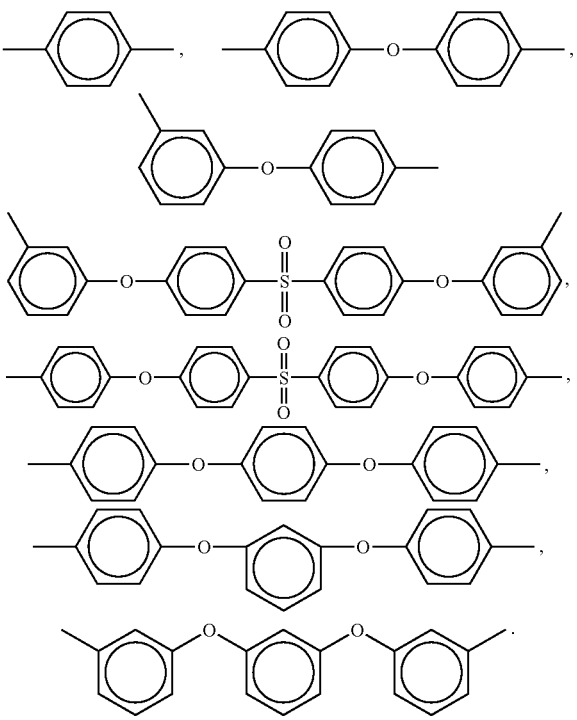

The first and third polyamic acid coating 200a and 200c includes evenly distributed inorganic additives, reducing coefficient of thermal expansion, resulting in adhesive suitability, which is provided to the double-sided metal clad laminate. The obtained double-sided metal clad laminate exhibits superior thermal resistance and dimensional stability.

The inorganic additive can include silicon oxide, talc, calcium carbonate, or combinations thereof, and the grain size of the inorganic additive can be of between 5-50 nm.

The coefficient of thermal expansion of the polyimide film has direct ratio relations with the amount of the inorganic additive. The amount of the inorganic additive is preferably between 0.1 and 40% by weight, preferably between 5 and 30%, based on the solid content of the polyamic acid coating.

In order to maintain the dispersibility of inorganic additive among the coating, the inorganic additive can be modified by a silane modification agent, preventing the inorganic additive from aggregation when increasing the amount of the inorganic additive. The modification can be performed at 60-80° C. for 1-6 hrs, wherein the weight ratio of the inorganic additive and the silane modification agent is 8:0.01-8:2.

The silane modification agent is an epoxy-groups-containing silane modification agent or an amino-groups-containing silane modification agent. The epoxy-groups-containing silane modification agent includes β-(3,4-epoxycyclohexyl)-ethyltrimethoxysilane, γ-glycidoxypropyl-trimethoxysilane, or γ-glycidoxypropyl-methyldiethoxysilane. The amino-groups-containing silane modification agent includes N-phenyl-γ-aminopropyltrimethoxysilane, γ-aminopropyltriethoxysilane, or N-β-(aminoethyl)-γ-aminopropyltrimethoxysilane.

The first and third polyamic acid coating 200a and 200c include a surfactant. In order to achieve a multi-layer film including of thermoplastic polyamic acid coating and the thermal resistant polyamic acid coating, the surface properties of the three coatings are modified to be suitable for coating, to avoid the occurrence of dewetting. The surface tension of the polyamic acid coating is modified by the amount of the surfactant. The amount of the surfactant is between 0.01 and 1.0% by weight, based on the solid content of the polyamic acid coating. The weight ratio of the surfactant of the first polyamic acid coating is of between 0.01-0.2%, and the weight ratio of the surfactant of the third polyamic acid coating is of between 0.2-1%.

The surfactant employed in the first and third polyamic acid coating can be the same, but the amount of the surfactant of the third polyamic acid coating is larger than that of the amount of the surfactant of the first polyamic acid coating, in order to make sure that the surface tension of the third polyamic acid coating is lowest among the three polyamic acid coatings.

The surfactant can be a cationic surfactant (such as certyltrimethyl ammonium bromide), anionic surfactant (such as sodium dodecyl sulfate), amphoteric surfactant (such as alkyl betaine), nonionic surfactant (such as lauryl alcohol ether, siloxane, fluorinated alkyl ester), or combinations thereof. The siloxane surfactant can be a polydimethylsiloxanes sold and fabricated by Dow Corning under the trade number of DC510, and the fluorinated alkyl ester surfactant is FC4430 or FC431 (trade number) sold and fabricated by 3M.

In embodiments of the invention, the first and third polyamic acid coating can include the same or different surfactants. One key of the invention is that the surface tension of the first polyamic acid coating, the second polyamic acid coating, and the third polyamic acid coating must be controlled to satisfy relations of S1>S2>S3, wherein the labels S1, S2, and S3 indicate respectively the surface tension of the first polyamic acid coating, the second polyamic acid coating, and the third polyamic acid coating. Further, S1 is not more than 60 dyne/cm, and S3 is not less than 15 dyne/cm, Namely, the surface tensions of S1, S2, and S3 satisfy relations of 60 dyne/cm≧S1>S2>S3≧15 dyne/cm.

The solvent of the first and third polyamic acid coating 200a and 200c is unlimited and includes the solvent or co-solvent which can dissolve polyamic acid. The solvent can include N-methyl-2-pyrrolidone (NMP), N,N-dimethylacetamide (DMAc), γ-butyrolactone (GBL), xylene, toluene, or co-solvent thereof.

The second polyamic acid coating 200b includes polyamic acid and solvent, and can further include a surfactant to modify the surface tension thereof. The weight ratio of the surfactant of the second polyamic acid coating 200b is between 0.1 and 0.25, based on the total solid content of the second polyamic acid coating. The second polyamic acid coating has a coefficient of thermal expansion of less than 20 ppm/° C. The tetracarboxylic dianhydride monomer used in the second polyamic acid coating includes 3,3',4,4'-biphenyl tetracarboxylic dianhydride (BPDA), and 3,3',4,4'-benzophenone-tetracarboxylic dianhydride (BTDA). The monomer used in the second polyamic acid coating includes p-phenylene diamine (P-PDA) or 4,4'-oxydianiline (4,4'-ODA).

The solvent of the second polyamic acid coating 200b is unlimited and includes solvent or co-solvent which can dissolve polyamic acid. The solvent can include N-methyl-2-pyrrolidone (NMP), N,N-dimethylacetamide (DMAc), γ-butyrolactone (GBL), xylene, toluene, or co-solvent thereof.

Figure 3:
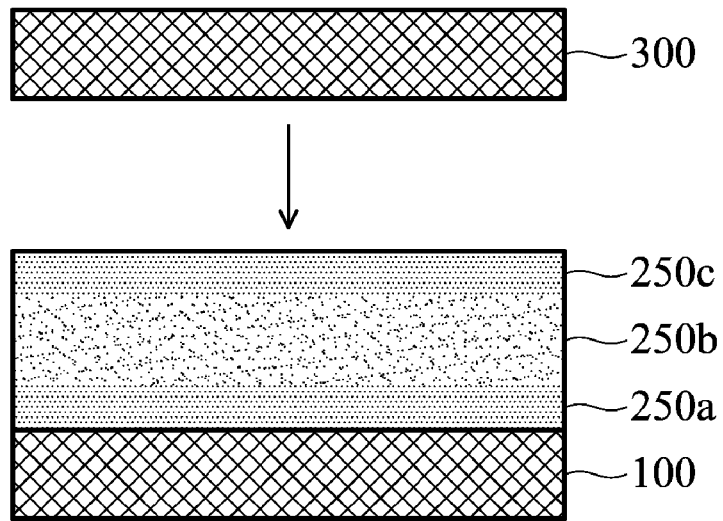
Figure 4:
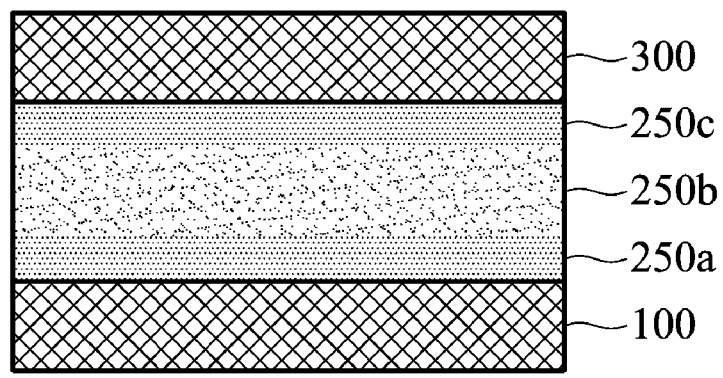

Please refer to FIG. 3, the first polyamic acid coating, a second polyamic acid coating, and a third polyamic acid coating 200a, 200b, and 200c are subjected to high temperature cyclization, obtaining a multilayer polyimide film 250a, 250b, 250c. Finally, another copper foil 300 is hot pressed on the multilayer polyimide film, thereby fabricating an adhesiveless double-sided metal clad laminate, as shown in FIG. 4. The temperature of the cyclization is between 300-350° C. The thickness of the polyimide film 250a and 250c is controlled to be between 1-5 μm, and the thickness of the thermal resistant polyimide film 250b is controlled to be between 9-30 μm, and the coefficient of thermal expansion of the thermal resistant polyimide film 250b is less than 20 ppm/° C. The heat pressed process can be performed at 350° C. under a pressure of 50-80 Kg/cm2 for 5-20 mins.

Accordingly, the method for fabricating the double-sided metal clad laminates of the invention includes co-extruding a plurality of polyamic acid coatings on the first metal foil and hot pressing a second metal foil on the multilayer polyimide film. In comparison with the conventional single-sided metal clad laminate, the method for fabricating the double-sided metal clad laminates of the invention merely increases one process step, thus having advantages such as having a simplified process and reduced cost. Further, the obtained double-sided metal clad laminate has superior flatness and thermal resistance.

Without intending to limit the invention in any manner, the present invention will be further illustrated by the following examples.

Preparation of Thermoplastic Polyamic Acid

Synthetic Example 1

In a four-neck flask purged with nitrogen, 16.6729 g (0.5 mol) of m-BAPS and 11.2566 g (0.5 mol) of APB were dissolved in 250 ml of N-methyl-2-pyrrolidone/Toluen co-solvent (N-methyl-2-pyrrolidone/Toluene=80/20). After thorough stirring at room temperature, 7.1703 g (0.3 mole) of ODPA was added into the four-neck flask and the mixture was stirred at room temperature, followed by addition of 15.8780 g (0.7 mole) of BPDA by batch. After stirring for 3 hrs, a thermoplastic polyamic acid solution (1) was obtained. Separately, 36 g of nano-scale silca solution (solid content: 25%) was dissolved in 32 g of NMP as solvent and reacted with 0.2 g KBE402 (γ-glycidoxypropyl-methyldiethoxysilane, sold and fabricated by ShinEtsu) serving as a surface modification agent at 60° C. for 120 mins, obtaining an evenly distributed nano-scale silca solution. Thereafter, the evenly distributed nano-scale silca solution was added into the thermoplastic polyamic acid solution (1), obtaining a thermoplastic polyamic acid composition (1) with silca (15 wt %).

Synthetic Example 2

In a four-neck flask purged with nitrogen, 2.2355 g (0.1 mole) of Siloxane248 (1,3-bis(bisaminopropyl)tetramethyl disiloxane) was dissolved in 250 ml of N-methyl-2-pyrrolidone/Toluen co-solvent (N-methyl-2-pyrrolidone/Toluene=80/20), and reacted with 2.6499 g (0.1 mole) of BPDA. After stirring for 30 mins, 11.6957 g (0.3 mole) of m-BAPS and 10.8168 g (0.6 mole) of 4.4'-ODA were added into the flask. After stirring for 3 hrs, a thermoplastic polyamic acid solution (2) was obtained. Separately, 20.4 g of nano-scale silca solution (solid content: 25%) was dissolved in 22.4 g of NMP as solvent and reacted with 0.2 g KBE402 (γ-glycidoxypropyl-methyldiethoxysilane, sold and fabricated by ShinEtsu) serving as a surface modification agent at 60° C. for 120 mins, obtaining an evenly distributed nano-scale silca solution. Thereafter, the evenly distributed nano-scale silca solution was added into the thermoplastic polyamic acid solution (2), obtaining a thermoplastic polyamic acid composition (2) with silca (10 wt %).

Synthetic Example 3

In a four-neck flask purged with nitrogen, 16.3268 g (0.5 mole) of BAPS and 11.6230 g (0.5 mole) of TPE-Q were dissolved in 250 ml of N-methyl-2-pyrrolidone/Toluen co-solvent (N-methyl-2-pyrrolidone/Toluene=80/20). After stirring for 30 mins, 11.4685 g (0.49 mole) of ODPA was added into the flask, followed by two separate additions of 12.1555 g (0.5 mole) of BTDA. After stirring for 3 hrs, a thermoplastic polyamic acid solution (3) was obtained. Separately, 51 g of nano-scale silca solution (solid content: 25%) was dissolved in 32 g of NMP as solvent and reacted with 0.2 g KBE402 (γ-glycidoxypropyl-methyldiethoxysilane, sold and fabricated by ShinEtsu) serving as a surface modification agent at 60° C. for 120 mins, obtaining an evenly distributed nano-scale silca solution. Thereafter, the evenly distributed nano-scale silca solution was added into the thermoplastic polyamic acid solution (3), obtaining a thermoplastic polyamic acid composition (3) with silca (20 wt %).

Synthetic Example 4

In a four-neck flask purged with nitrogen, 20.9766 g (0.7 mole) of BAPP and 14.3800 g (0.3 mole) of 4.4'-ODA were dissolved in 250 ml of N-methyl-2-pyrrolidone/Toluen co-solvent (N-methyl-2-pyrrolidone/Toluene=80/20), followed by addition 10.0302 g (0.3 mole) of TAHQ. After stirring for 30 mins, 15.6147 g (0.69 mole) of ODPA was added into the flask. After stirring for 3 hrs, a thermoplastic polyamic acid solution (4) was obtained. Separately, 68 g of nano-scale silca solution (solid content: 25%) was dissolved in 32 g of NMP as solvent and reacted with 0.2 g KBE402 (γ-glycidoxypropyl-methyldiethoxysilane, sold and fabricated by ShinEtsu) serving as a surface modification agent at 60° C. for 120 mins, obtaining an evenly distributed nano-scale silca solution. Thereafter, the evenly distributed nano-scale silca solution was added into the thermoplastic polyamic acid solution (4), obtaining a thermoplastic polyamic acid composition (4) with silca (20 wt %).

Synthetic Example 5

In a four-neck flask purged with nitrogen, 15.1460 g (0.7 mole) of TPE-Q and 9.6145 g (0.3 mole) of m-BAPS were dissolved in 250 ml of N-methyl-2-pyrrolidone/Toluen co-solvent (N-methyl-2-pyrrolidone/Toluene=80/20), followed by addition 10.0302 g (0.3 mole) of TAHQ by batch. After stirring for 3 hrs, a thermoplastic polyamic acid solution (5) was obtained. Separately, 22.4 g of nano-scale silca solution (solid content: 25%) was dissolved in 32 g of NMP as solvent and reacted with 0.2 g KBE402 (γ-glycidoxypropyl-methyldiethoxysilane, sold and fabricated by ShinEtsu) serving as a surface modification agent at 60° C. for 120 mins, obtaining an evenly distributed nano-scale silca solution. Thereafter, the evenly distributed nano-scale silca solution was added into the thermoplastic polyamic acid solution (5), obtaining a thermoplastic polyamic acid composition (5) with silca (10 wt %).

Synthetic Example 6

In a four-neck flask purged with nitrogen, 1.4699 g (0.3 mole) of m-BAPS and 12.3760 g (0.7 mole) of 3.4'-ODA were dissolved in 250 ml of N-methyl-2-pyrrolidone/Toluen co-solvent (N-methyl-2-pyrrolidone/Toluene=80/20), followed by addition 27.1300 g (0.99 mole) of ODPA by batch. After stirring for 3 hrs, thermoplastic polyamic acid solution (6) was obtained. Separately, 36 g of nano-scale silca solution (solid content: 25%) was dissolved in 32 g of NMP as solvent and reacted with 0.2 g KBE402 (γ-glycidoxypropyl-methyldiethoxysilane, sold and fabricated by ShinEtsu) serving as a surface modification agent at 60° C. for 120 mins, obtaining an evenly distributed nano-scale silca solution. Thereafter, the evenly distributed nano-scale silca solution was added into the thermoplastic polyamic acid solution (6), obtaining a thermoplastic polyamic acid composition (6) with silca (15 wt %).

Comparative Synthetic Example 1

The Comparative Synthetic Example 1 was performed the same as Synthetic Example 1, except for addition of silca solution, obtaining a thermoplastic polyamic acid composition (7) without silca.

Preparation of Thermal Resistant Polyamic Acid

Synthetic Example 7

In a four-neck flask purged with nitrogen, 9.9328 g (0.85 mole) of P—PDA and 3.2460 g (0.15 mole) of 4.4'-ODA were dissolved in 250 ml of N-methyl-2-pyrrolidone/Toluen co-solvent (N-methyl-2-pyrrolidone/Toluene=80/20), followed by addition 3.4840 g (0.1 mole) of BTDA at room temperature. After stirring for 30 mins, 28.3309 g (0.89 mole) of BPDA was added into the flask by batch. After stirring for 3 hrs, thermal resistant polyamic acid was obtained. The surfactant FC-4430 was added respectively into thermoplastic polyamic acid compositions (1)-(6) (disclosed in Synthetic Examples 1-6), and thermal resistant polyamic acid (disclosed in Synthetic Example 7) with the amount shown in Table 1, thereby modifying the surface tension thereof.

The addition amount of the surfactant for the thermoplastic polyamic acid compositions (1)-(6) and thermal resistant polyamic acid was between 0.05 wt %~0.5 wt %. The surface tension was measured by a Digital-Tensionmeter K10ST (Kruss, Germany), the glass transition temperature was measured by a TMA Q-400 (Du-Pont), and the viscosity was measured by a BROOKFIELD DV-III ultra at 25° C.

Fabrication of Double-Sided Copper Clad Laminate

Examples 1-6

In example 1, a first-layer thermoplastic polyamic acid (1) (disclosed in Synthetic Example 1), a second-layer thermal resistant polyamic acid (disclosed in Synthetic Example 7), and a third-layer thermoplastic polyamic acid (1) (disclosed in Synthetic Example 1) were co-extruded on a copper foil (sold by Furukawa with trade No. F2-WS, 1/2Qz,). The coatings were baked at 120° C. for 5 mins, 180° C. for 10 mins, and then 350° C. for another 60 mins, thus obtaining a copper foil with multilayer polyimide film. Finally, another copper foil was heat pressed on the aforementioned structure, obtaining an adhesiveless double-sided copper clad laminate, wherein the lamination was carried out at 350° C., 60 kg/cm2 for 20 mins.

Examples 2-6 were performed the same as Example 1, except for substitution of thermoplastic polyamic acid (2)-(6) for thermoplastic polyamic acid (1). The structure, thickness and components thereof are shown in Table 1.

The peeling strength, solder resistance (288° C., 30 seconds), planarization (warping level), and dimensional stability of the double-sided copper clad laminates of the examples are listed in Table 2, wherein the peeling strength was measured following the procedure of IPC-TM-650 (2.4.9), the solder resistance was measured following the procedure of IPC-TM-650 (2.4.13), and the dimensional stability was measured following the procedure of IPC-TM-650 (2.2.4). The flatness properties of the copper clad laminates were evaluated as follows, before copper foil etching, after one side etching, and dual side etching, respectively. The clad laminates were cut into A4 sized test specimens. The test specimens were attached to a wall with the upper ends pressed by a ruler against the wall, and the distances of the lower ends with respect to the wall were measured. The measured distances of the (lower) right side end (L1) and (lower) left side end (L2) were averaged ((L1+L2)/2).

Comparative Examples 1 and 2

Comparative Example 1 was performed the same as Example 1, except that the surface tension of the second-layer thermal resistant polyamic acid (disclosed in Synthetic Example 7) was modified (by adjusting the amount of surfactant) to be equal to that of the third-layer thermoplastic polyamic acid (1) (disclosed in Synthetic Example 1). Further, Comparative Example 2 was performed the same as Example 1, except that the surface tension of the second-layer thermal resistant polyamic acid (disclosed in Synthetic Example 7) was modified (by adjusting the amount of surfactant) to be less than that of the first-layer and third-layer thermoplastic polyamic acid (1) (disclosed in Synthetic Example 1). The surface dewetting behavior of the obtained double-sided copper clad laminates was observed. The properties of the obtained double-sided copper clad laminates are listed in Table 2.

Comparative Example 3

Comparative Example 3 was performed the same as Example 1, except for the absence of silica in the thermoplastic polyamic acid (1). The properties of the obtained double-sided copper clad laminate is listed in Table 2.

TABLE 1

| | First-layer thermoplastic polyamic acid | | | | | Second-layer thermal-resistant polyamic acid | | | | |
|---|---|---|---|---|---|---|---|---|---|---|
| | Synthetic Example | Surface tension (S1) (dyne/cm) | weight ratio of surfactant (wt %) | viscosity (cps) | thickness (μm) | Synthetic Example | Surface tension (S1) (dyne/cm) | weight ratio of surfactant (wt %) | viscosity (cps) | thickness (μm) |
| Example 1 | 1 | 38 | 0.05 | 4500 | 2 | 7 | 33 | 0.20 | 8500 | 9 |
| Example 2 | 2 | 36 | 0.08 | 3800 | 2 | 7 | 33 | 0.20 | 8500 | 9 |
| Example 3 | 3 | 37 | 0.05 | 3200 | 3 | 7 | 34 | 0.25 | 8500 | 10 |
| Example 4 | 4 | 36 | 0.08 | 3500 | 3 | 7 | 34 | 0.25 | 8500 | 19 |
| Example 5 | 5 | 37 | 0.05 | 2600 | 3 | 7 | 34 | 0.25 | 8500 | 19 |
| Example 6 | 6 | 37 | 0.05 | 3400 | 3 | 7 | 33 | 0.20 | 8500 | 20 |
| Comparative Example 1 | Comparative Synthetic Example 1 | 38 | 0.05 | 4500 | 2 | 7 | 33 | 0.20 | 8500 | 9 |
| Comparative Example 2 | 1 | 38 | 0.05 | 4500 | 2 | 7 | 33 | 0.20 | 8500 | 9 |
| Comparative Example 3 | 1 | 38 | 0.05 | 4500 | 2 | 7 | 33 | 0.20 | 8500 | 9 |

| | Third-layer thermoplastic polyamic acid | | | | | |
|---|---|---|---|---|---|---|
| | Synthetic Example | Surface tension (S1) (dyne/cm) | weight ratio of surfactant (wt %) | viscosity (cps) | thickness (μm) | Thickness (μm) appearance |
| Example 1 | 1 | 23 | 0.50 | 4500 | 2 | 13 good |
| Example 2 | 2 | 25 | 0.40 | 3800 | 2 | 13 good |
| Example 3 | 3 | 28 | 0.35 | 3200 | 3 | 16 good |
| Example 4 | 4 | 25 | 0.40 | 3500 | 3 | 25 good |
| Example 5 | 5 | 27 | 0.20 | 2600 | 3 | 25 good |
| Example 6 | 6 | 28 | 0.35 | 3600 | 3 | 26 good |
| Comparative Example 1 | Comparative Synthetic Example 1 | 33 | 0.20 | 4500 | 2 | 13 dewetting |
| Comparative Example 2 | 1 | 38 | 0.05 | 4500 | 2 | 13 dewetting |
| Comparative Example 3 | 1 | 23 | 0.50 | 4500 | 2 | 13 good |

PS: the weight ratio of the surfactant based on the total solid content of the composition

TABLE 2

| | | Example 1 | Example 2 | Example 3 | Example 4 | Example 5 | Example 6 | Comparative Example 3 |
|---|---|---|---|---|---|---|---|---|
| CTE (ppm/°C.) | | 27 | 26 | 28 | 26 | 28 | 27 | 33 |
| Pressed conditions | Temperature (°C.) | 330 | 350 | 350 | 350 | 320 | 320 | 330 |
| | pressure (kg/cm2) | 60 | 60 | 60 | 60 | 60 | 60 | 60 |
| | time (mins) | 10 | 10 | 10 | 10 | 10 | 10 | 10 |
| peeling strength (kgf/cm) | | 1.2 | 0.9 | 1.0 | 0.7 | 1.1 | 1.0 | 1.1 |
| flatness | Before copper etching (FCCL) | flat (0.8 mm) | flat (0.5 mm) | flat (0.8 mm) | flat (0.5 mm) | flat (1.0 mm) | flat (0.7 mm) | warped (15 mm) |
| | After copper etching (Film) | flat (2.0 mm) | flat (2.5 mm) | flat (5.5 mm) | flat (3.0 mm) | flat (8.0 mm) | flat (8.0 mm) | warped (28 mm) |
| solder resistance (288° C. * 30 sec) | | pass | pass | pass | pass | pass | pass | fail |
| dimensional stability (%) | | 0.05 | 0.06 | 0.08 | 0.06 | 0.08 | 0.08 | 0.12 |

As shown in Table 1, since the surface tension of the polyamic acid coatings disclosed in Examples 1-6 satisfy the relations of S1>S2>S3 (S1, S2, and S3 indicate respectively the surface tension of the first-layer polyamic acid coating, the second-layer polyamic acid coating, and the third-layer polyamic acid coating), there was no surface dewetting behavior observed. Further, the surface dewetting behavior was observed in the double-sided copper clad laminates as disclosed in Comparative Examples 1 and 2, wherein the relation of the surface tension in Comparative Example 1 was S1>S2=S3, and the relation of surface tension in Comparative Example 2 was S1=S3>S2.

As shown in Table 2, the double-sided copper clad laminates as disclosed in Examples 1-6 exhibited superior flatness, solder resistance, and dimensional stability. To the contrary, the double-sided copper clad laminate as disclosed in Comparative Example 3 (absence of silica) was warped before copper-etching and exhibited inferior solder resistance.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating double-sided metal clad laminates, comprising:
providing a first metal foil;
co-extruding a plurality of polyamic acid coatings on the first metal foil;
heat imidization the plurality of polyamic acid coatings to provide a multilayer polyimide film; and
hot pressing a second metal foil on the multilayer polyimide film, providing the double-sided metal clad laminate, wherein the plurality of polyamic acid coatings comprise:
a first polyamic acid coating, a second polyamic acid coating, and a third polyamic acid coating with a surface tension of S1, S2, and S3, respectively, satisfying relations of S1>S2>S3,
wherein the first polyamic acid coating is the coating directly applied on the first metal foil.

2. The method as claimed in claim 1, wherein the surface tensions of S1, S2, and S3 satisfy relations of 60 dyne/cm≧S1>S2>S3≧15 dyne/cm.

3. The method as claimed in claim 1, wherein the plurality of polyamic acid coatings is co-extruded by a co-extrusion feedblock.

4. The method as claimed in claim 1, wherein the plurality of polyamic acid coatings is co-extruded by a multilayer co-extrusion die.

5. The method as claimed in claim 1, wherein the first polyamic acid coating and the third polyamic acid coating comprises thermoplastic polyamic acid, inorganic powder, surfactant, and solvent.

6. The method as claimed in claim 5, wherein the inorganic powder comprises silicon oxide, mica, calcium carbonate, or combinations thereof.

7. The method as claimed in claim 5, wherein the grain size of the inorganic powder is of between 5-50 nm.

8. The method as claimed in claim 5, wherein the weight ratio of the inorganic powder is of between 0.5-40%, based on the total solid content of the first polyamic acid coating or the third polyamic acid coating.

9. The method as claimed in claim 5, wherein the surface of the inorganic powder is modified by a silane modification agent.

10. The method as claimed in claim 9, wherein the silane modification agent is an epoxy-groups-containing silane modification agent, comprising β-(3,4-epoxycyclohexyl)-ethyltrimethoxysilane, γ-glycidoxypropyl-trimethoxysilane, or γ-glycidoxypropyl-methyldiethoxysilane.

11. The method as claimed in claim 9, wherein the silane modification agent is an amino-groups-containing silane modification agent, comprising N-phenyl-γ-aminopropyltrimethoxysilane, γ-aminopropyltriethoxysilane, or N-β-(aminoethyl)-γ-aminopropyltrimethoxysilane.

12. The method as claimed in claim 5, wherein the amount of the surfactant of the third polyamic acid coating is larger than that of the amount of the surfactant of the first polyamic acid coating.

13. The method as claimed in claim 12, wherein the weight ratio of the surfactant is of between 0.01-1.0%, based on the total solid content of the first polyamic acid coating or the third polyamic acid coating, and the weight ratio of the surfactant of the first polyamic acid coating is of between 0.01-0.2%, and the weight ratio of the surfactant of the third polyamic acid coating is of between 0.2-1%.

14. The method as claimed in claim 5, wherein the first polyamic acid coating and the third polyamic acid coating have same components and same amounts of components, but do not have the same amounts of surfactant.

15. The method as claimed in claim 5, wherein the first polyamic acid coating and the third polyamic acid coating have substantially different compositions.

* * * * *